United States Patent [19]

Linn et al.

[11] Patent Number: 5,547,896
[45] Date of Patent: Aug. 20, 1996

[54] DIRECT ETCH FOR THIN FILM RESISTOR USING A HARD MASK

[75] Inventors: Jack H. Linn, Melbourne; John T. Gasner, Satellite Beach; Stephen J. Gaul; Chris A. McCarty, both of Melbourne, all of Fla.

[73] Assignee: Harris Corporation, Melbourne, Fla.

[21] Appl. No.: 387,233

[22] Filed: Feb. 13, 1995

[51] Int. Cl.$^6$ .................................................. H01L 21/70
[52] U.S. Cl. .................. 437/60; 437/918; 148/DIG. 136; 216/16
[58] Field of Search ............................ 437/60, 245, 246, 437/918; 148/DIG. 136; 156/664; 257/537; 252/79.2; 216/16, 108, 104

[56] References Cited

U.S. PATENT DOCUMENTS

| | | | |
|---|---|---|---|
| 3,904,461 | 9/1975 | Estep et al. | 216/16 |
| 4,226,932 | 10/1980 | Ferraris | 216/16 |
| 4,682,143 | 7/1987 | Chu et al. | 204/192.21 |
| 4,970,014 | 11/1990 | Garcia | 156/665 |
| 5,076,906 | 12/1991 | DerMarderosian, Jr. | 204/153.1 |
| 5,102,499 | 4/1992 | Jodgens et al. | 156/664 |
| 5,256,247 | 10/1993 | Watanabe | 156/662 |
| 5,407,841 | 4/1995 | Lico et al. | 437/162 |
| 5,420,063 | 5/1995 | Moghsoudnia et al. | 437/60 |
| 5,468,672 | 11/1995 | Rosvold | 437/60 |

OTHER PUBLICATIONS

S. Wolf, "Silicon Processing For the VLSI Era, vol. 1", Lattice Press (1986), pp. 335 and 367.

*Primary Examiner*—George Fourson
*Assistant Examiner*—Thomas G Bilodeau
*Attorney, Agent, or Firm*—Rogers & Killeen

[57] ABSTRACT

In a method of etching a thin film resistor material, such as NiCr or CrSi, and of producing a thin film resistor, a non-photoresist hard mask is deposited on an exposed surface of thin film resistor material, a delineated portion of the hard mask is etched with a hydrogen peroxide etchant that does not affect the thin film resistor material to expose the material therebeneath, and the exposed thin film resistor material is etched with a second etchant that does not affect the hard mask. The second etchant may be sulfuric acid heated to greater than 125° C. for NiCr or a mixture of phosphoric acid, nitric acid and hydrofluoric acid for CrSi. The hard mask preferably comprises TiW.

30 Claims, 2 Drawing Sheets

DIRECT ETCH FOR THIN FILM RESISTOR USING A HARD MASK

BACKGROUND OF THE INVENTION

The present invention relates to methods of etching thin film resistor material, and more particularly to a method of cleanly etching NiCr or CrSi to form thin film resistors in semiconductor devices.

Thin film resistors are well known and may comprise a variety of resistive materials, with the chromium-based resistive materials nickel chromium (NiCr) and (CrSi) being common. Thin film resistors may include an electrical interconnect contacting the resistive material for passing a current therethrough. The efficiency and accuracy of the thin film resistor depends upon the condition of the resistive material and the cleanliness of the portion of the resistor contacting the electrical interconnect. Resistive material that is corroded or contaminated (e.g. has highly oxidized chromium) is undesirable because such conditions adversely affect the sheet resistance of the resistor. A "dirty" contact between the resistive material and the electrical interconnect adversely affects the contact resistance of the resistor.

Known methods of manufacturing thin film resistors are considered to be "dirty" because they contaminate and corrode the resistive material and increase the oxidation of the chromium, thereby adversely affecting the sheet resistance of the resistor. Known methods also leave "dirty" contacts between the resistive material and the electrical interconnect, thereby adversely affecting the contact resistance of the resistor.

One of the known methods of manufacturing NiCr thin film resistors includes depositing a photoresist (PR) mask over NiCr film and removing selected portions of the PR mask to expose portions of the NiCr. The exposed NiCr is then directly etched with an enchant that does not affect the PR mask, such as ceric sulfate. Ceric sulfate is known to be a "dirty" enchant which leaves residual ceric oxide contaminants across the wafer surface where the NiCr was removed. However, subsequent processing to remove the ceric oxide has an adverse effect on the exposed Furthermore, the PR mask and the PR strip process also leave residual contaminants, such as carbon and sulfur, on the surface of the exposed NiCr which has an undesirable corrosive effect on the NiCr film. The combined effect of these contaminants increases the oxidation of the Cr within the NiCr film, thereby adversely affecting the sheet resistance of the NiCr resistor and degrading the contact between the NiCr and an electrical interconnect, thereby degrading the performance of the NiCr resistor.

Another known method of producing NiCr thin film resistors uses a PR lift-off process rather than directly etching the NiCr. The lift-off process includes depositing a NiCr film over a patterned PR mask having open areas so that portions of the NiCr film are deposited into the open areas. After the NiCr is deposited, the PR mask is lifted-off to remove the portions of the NiCr not in the open areas. The lift-off process, however, leaves behind unwanted NiCr and PR residue which is difficult to remove and which adversely affects the contact between the NiCr and the electrical interconnect. As in the direct etch method, the lift-off process leaves residual contaminants, such as carbon and sulfur, on the surface of the NiCr. The unwanted contaminants adversely affect the contact resistance between the NiCr and the electrical interconnect. They also have a corrosive effect on the NiCr (e.g. increase the oxidation of the chromium) and thus adversely affect the sheet resistance.

Accordingly, it is an object of the present invention to provide a novel method of etching thin film resistor material that obviates the problems of the prior art.

It is another object of the present invention to provide a novel method of producing uncontaminated thin film resistors.

It is still another object of the present invention to provide a novel method of producing a thin film resistor in which a hard mask is deposited on a chromium-based film and etched with a first etchant that does not affect the film, and the exposed film is thereafter etched with a second etchant that does not affect the hard mask.

It is yet another object of the present invention to provide a novel method of cleanly etching a chromium-based thin film resistor in which portions of the material not to be etched are covered with a hard mask and in which the hard mask is etched with hydrogen peroxide (the first etchant) that does not affect the thin film.

It is a further object of the present invention to provide a novel method of cleanly etching NiCr in which portions of the NiCr not to be etched are covered with a hard mask and in which the NiCr is etched with sulfuric acid heated to greater than 125° C. (the second etchant) that does not affect the hard mask.

It is yet a further object of the present invention to provide a novel method of cleanly etching CrSi in which portions of the CrSi not to be etched are covered with a hard mask and in which the CrSi is etched with a mixture of primarily phosphoric acid (the second etchant) that does not affect the hard mask.

It is still a further object of the present invention to provide a novel method of manufacturing thin film resistors in which electrical interconnects for the resistors are patterned with a PR and in which the PR does not contact and thereby contaminate the thin film resistor.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1A:
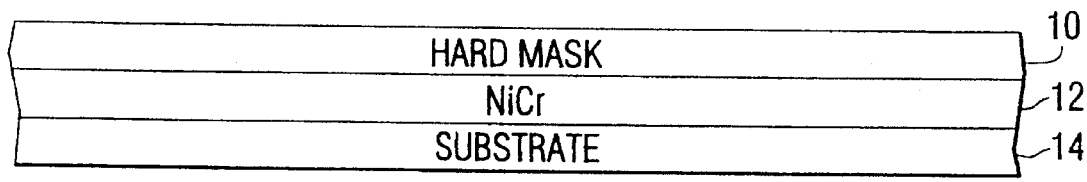
FIGS. 1a–1f are cross-sectional views illustrating the sequence of steps in an embodiment of the method of the present invention.

The sequence of steps in an embodiment of the method of the present invention may be seen in FIGS. 1a–1f. Referring to FIG. 1a, a thin film resistor material 12, such as NiCr or CrSi, may be conventionally deposited on a substrate 14 for a semiconductor device and a hard mask 10 may be deposited over the resistor material 12 without breaking vacuum over the resistor material 12. For example, the hard mask 10 may be deposited on the resistor material 12 in a deposition chamber without breaking the vacuum within the deposition chamber so that no contaminating materials are between the hard mask 10 and the material 12.

The hard mask 10 may be a non-photoresist material that is not affected by the etching effects of an etchant that may be used to etch the resistor material 12, namely sulfuric acid heated to greater than about 125° C. for a NiCr thin film resistor, and a mixture of phosphoric acid, nitric acid and hydrofluoric acid for a CrSi thin film resistor. While preferably comprised of TiW, the hard mask 10 may be comprised of other suitable materials, including silicon dioxide, silicon nitride, titanium nitride and molybdenum.

Figure 1B:
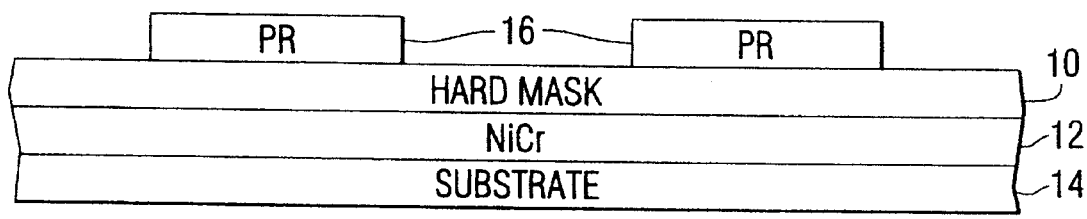
Figure 1C:
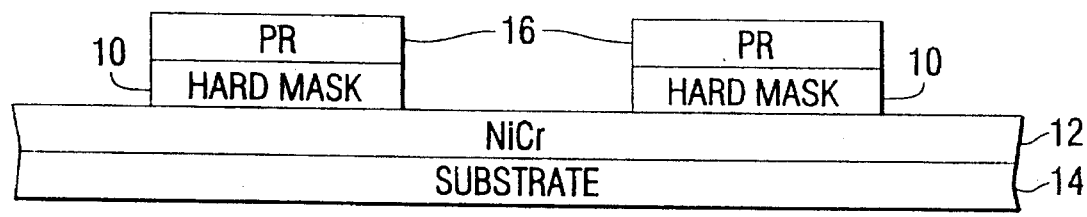

Referring now to FIG. 1b, the hard mask 10 may be delineated by depositing a PR mask 16 on the hard mask 10 and patterning the PR mask 16 so that it remains on the portions of the hard mask 10 overlying the portions of the resistor material 12 that will become the thin film resistors. Thereafter, as shown in FIG. 1c, the hard mask 10 may be etched with a first etchant to expose the portions of the resistor material 12 that will be etched. The first etchant may be any known etchant that does not contaminate or otherwise adversely affect the PR mask 16 and the resistor material 12. In a preferred embodiment, the first etchant is comprised of hydrogen peroxide.

Figure 1D:
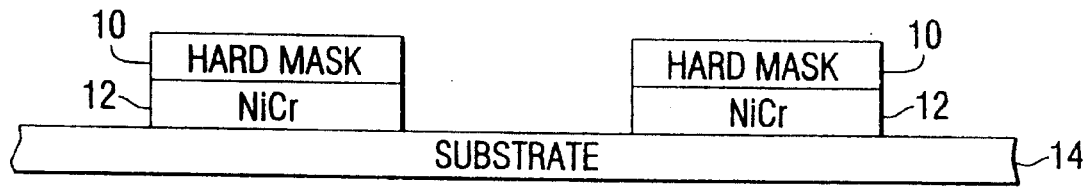

As shown in FIG. 1d, the PR mask 16 may then be removed by using, for example, a solvent strip, and thereafter, the resistor material 12 may be etched with a second etchant to remove unwanted thin film resistor material. The second etchant may be any known etchant that cleanly and uniformly etches the resistor material 12, that does not leave behind residue or contaminants which adversely affect the resistor material 12, or that does not otherwise adversely affect the resistor material 12. Furthermore, the second etchant may be such that it does not have an etching effect on the hard mask 10. In preferred embodiments, the second etchant for NiCr is comprised of sulfuric acid heated to greater than about 125° C., and the second etchant for CrSi is comprised of a mixture of phosphoric acid, nitric acid and hydrofluoric acid. An acceptable mixture of the latter second etchant is the known etchant comprised of 97% phosphoric acid, 2% nitric acid and 1% hydrofluoric acid.

Figure 1E:
Figure 1F:
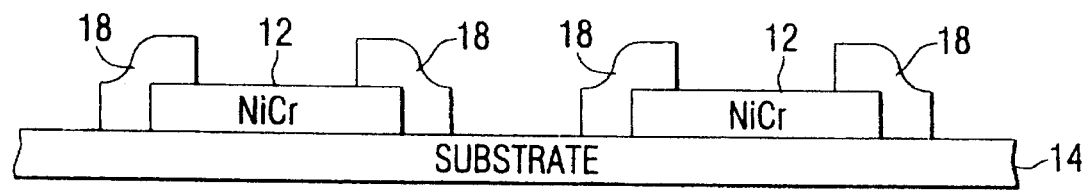

Thereafter, as shown in FIG. 1e, the remaining hard mask portions may be removed with an etchant that does not adversely affect the resistor material 12, such as hydrogen peroxide, thereby leaving behind clean resistor material 12 for contacting electrical interconnects. As shown in FIG. 1f, electrical interconnects 18 may be deposited and delineated on the resistor material 12 thereby forming plural resistors on a semiconductor substrate 14. The electrical interconnects 18 may be comprised of any electrically conductive material, with aluminum being preferred. The thin film resistors thereby formed are free of contamination that may affect contact resistance with the interconnect.

Figure 2A:
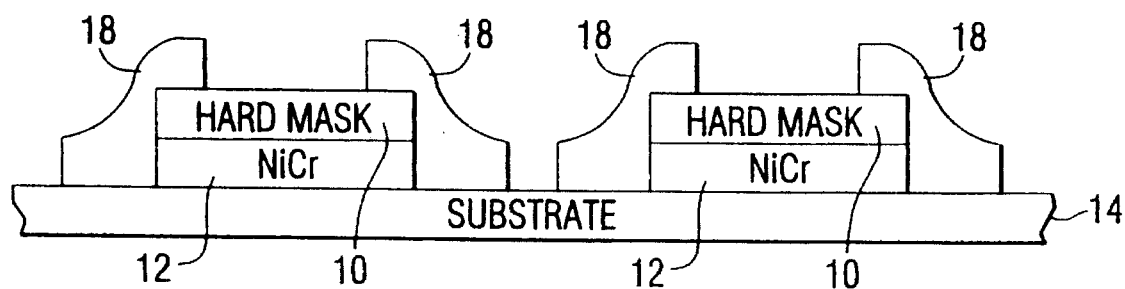
FIGS. 2a–2b are cross-sectional views illustrating alternative steps in an embodiment of the method of the present invention.
Figure 2B:
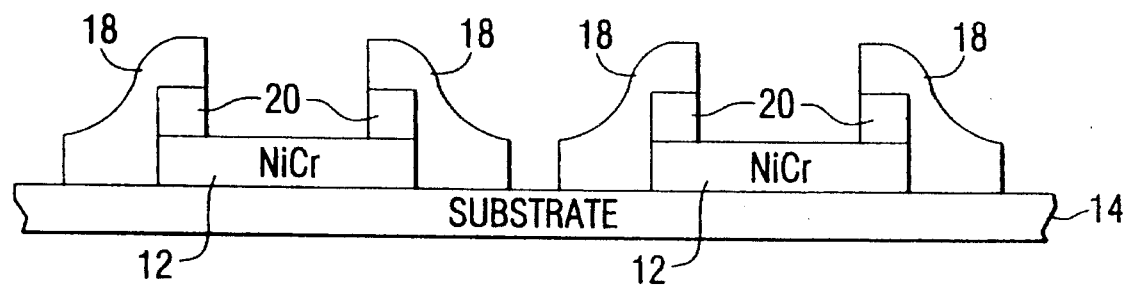

In another embodiment, and with reference now to FIG. 2a–2b, a photoresist may be used to delineate the interconnects 18. The electrical interconnect deposition and delineation may be performed prior to the removal of the delineated hard mask 10 from the resistor material 12 as shown in FIG. 2a so that the PR, PR solvent strip and interconnect metalization do not contact and contaminate the surface of the resistor material 12. More specifically, the electrical interconnect 18 is deposited and patterned with a PR mask, the unwanted portions of the electrical interconnect are etched with a suitable etchant, and the remaining PR is then removed with, for example, a solvent strip.

Thereafter, as shown in FIG. 2b, the portions of the hard mask not underlying the electrical interconnects are etched with an etchant that does not adversely affect the electrical interconnects 18 thereby leaving hard mask portions 20 between the electrical interconnects 18 and the resistor material 12. In a preferred embodiment, the hard mask is etched with hydrogen peroxide. In this way, the portions of the hard mask 20 between the resistor material 12 and the electrical interconnects 18 act as barriers and prevent interdiffusion between the resistor material 12 and the electrical interconnects 18 without significant effect on the electrical connection. Furthermore, the thin film resistors thereby formed are free of PR contamination and interconnect metalization across their surface.

Figure 3A:
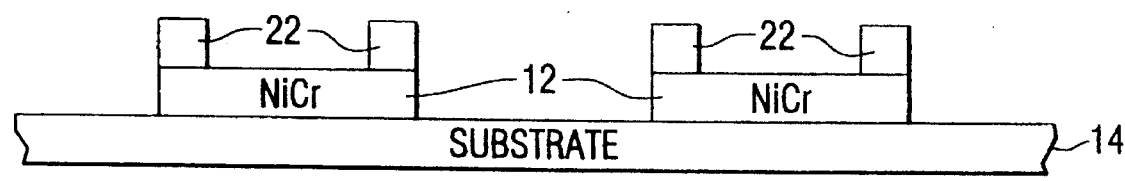
FIGS. 3a–3b are cross-sectional views illustrating further alternative steps in an embodiment of the method of the present invention.
Figure 3B:
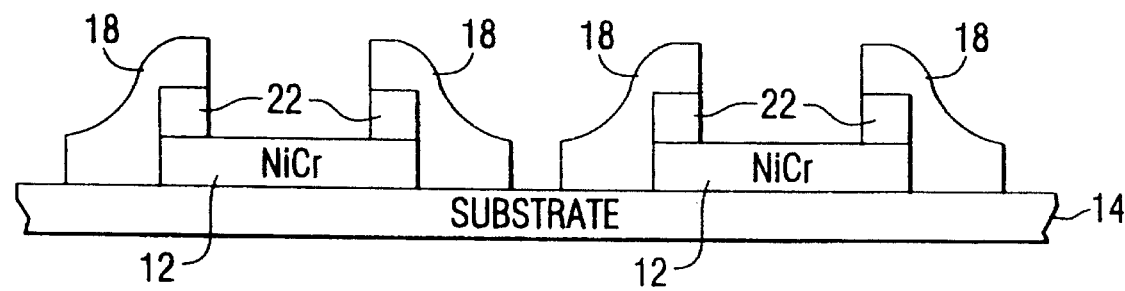

Alternatively, as shown in FIG. 3a, after the resistor material 12 has been etched, portions of the hard mask may be etched leaving behind those portions of the hard mask 22 overlying the portions of the resistor material 12 that are for contacting electrical interconnects. Thereafter, as shown in FIG. 3b, the electrical interconnects 18 may be deposited over portions of the remaining hard mask 22 thereby leaving hard mask portions 22 between the electrical interconnect 18 and the resistor material 12. The portions of the hard mask 22 between the resistor material 12 and the electrical interconnects 18 act as barriers and prevent interdiffusion between the resistor material 12 and the electrical interconnects 18 without significant effect on the electrical connection.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of etching a thin film resistor in a semiconductor device comprising the steps of:

(a) depositing a thin film resistor material on a substrate and depositing a non-photoresist hard mask on an exposed surface of the thin film resistor material in a deposition chamber without breaking a vacuum in the deposition chamber;

(b) etching a delineated portion of the hard mask with a first etchant that does not affect the thin film resistor material to expose the material therebeneath; and (c) wet etching the exposed thin film resistor material with a second etchant that does not affect the hard mask; and (d) etching the remaining hard mask except the portions of the hard mask overlying selected portions of the thin film resistor material for contacting electrical interconnects.

2. The method of claim 1 where the thin film resistor material comprises NiCr and wherein the hard mask comprises one of TiW and molybdenum and the first etchant comprises hydrogen peroxide.

3. The method of claim 2 wherein the second etchant is sulfuric acid at a temperature greater than 125° C.

4. The method of claim 1 where the thin film resistor material comprises CrSi and wherein the hard mask comprises one of TiW and molybdenum and the first etchant comprises hydrogen peroxide.

5. The method of claim 4 wherein the second etchant is a mixture of phosphoric acid, nitric acid and hydrofluoric acid.

6. The method of claim 1 further comprising the step of depositing electrical interconnects on the remaining hard mask portions.

7. The method of claim 1 where the hard mask comprises a material selected from the group of materials consisting of silicon dioxide, silicon nitride, titanium nitride, molybdenum, and titanium tungsten.

8. A method of making plural thin film resistors in a semiconductor device wherein the resistors have clean surfaces for minimal contact resistance with electrical interconnects in contact therewith, the method comprising the steps of:

(a) providing a thin film of resistor material on a surface of the semiconductor device and depositing a TiW mask on the film in a deposition chamber without breaking a vacuum in the deposition chamber;

(b) delineating the TiW mask to a pattern corresponding to multiple resistors;

(c) etching the delineated TiW mask with hydrogen peroxide to expose the film therebeneath;

(d) wet etching the exposed film with a second etchant to leave multiple thin film resistors beneath the delineated TiW mask;

(e) removing the remaining TiW mask; and (f) applying electrical interconnects to each of the resistors, whereby the plural resistors are free of contamination that may affect contact resistance with the interconnect.

9. The method of claim 8 wherein the resistor material comprises NiCr and the second etchant comprises sulfuric acid that is at a temperature greater than 125° C.

10. The method of claim 8 wherein the resistor material comprises CrSi and the second etchant comprises a mixture of phosphoric acid, nitric acid and hydrofluoric acid.

11. A method of producing a thin film resistor comprising the steps of masking a portion of a NiCr film with a hard mask that is immune to the etching effects of sulfuric acid heated to greater than 125° C., etching the hard mask with hydrogen peroxide that does not affect the film, and etching the film with sulfuric acid at a temperature greater than 125° C.

12. A method of producing a thin film resistor comprising the steps of masking a portion of a CrSi film with a hard mask that is immune to the etching effects of an etchant comprised of a mixture of phosphoric acid, nitric acid and hydrofluoric acid, etching the hard mask with hydrogen peroxide that does not affect the film, and etching the film with a mixture of phosphoric acid, nitric acid and hydrofluoric acid.

13. A method of etching a thin film resistor in a semiconductor device comprising the steps of:

(a) depositing a thin film resistor comprising NiCr on a substrate and depositing a non-photoresist hard mask comprising one of TiW and molybdenum on an exposed surface of the thin film resistor;

(b) etching a delineated portion of the hard mask with a hydrogen peroxide etchant that does not affect the thin film resistor to expose the resistor therebeneath; and (c) etching the exposed thin film resistor material with a second etchant that does not affect the hard mask;

(d) etching the remaining hard mask with the hydrogen peroxide etchant to thereby expose the thin film resistor therebeneath; and (e) depositing electrical interconnects on the exposed thin film resistor.

14. The method of claim 13 wherein the second etchant is sulfuric acid at a temperature greater than 125° C.

15. The method of claim 13 wherein the step of depositing the thin film resistor and depositing the hard mask thereon are carried out in a deposition chamber without breaking a vacuum in the deposition chamber.

16. A method of etching a thin film resistor in a semiconductor device comprising the steps of:

(a) depositing a thin film resistor material on a substrate and depositing a non-photoresist hard mask on an exposed surface of the thin film resistor material in a deposition chamber without breaking a vacuum in the deposition chamber;

(b) etching a delineated portion of the hard mask with a first etchant that does not affect the thin film resistor material to expose the material therebeneath; and (c) wet etching the exposed thin film resistor material with a second etchant that does not affect the hard mask; and (d) etching the remaining hard mask with the first etchant to thereby expose the thin film resistor material therebeneath.

17. The method of claim 16 where the thin film resistor material comprises NiCr and wherein the hard mask comprises one of TiW and molybdenum and the first etchant comprises hydrogen peroxide.

18. The method of claim 17 wherein the second etchant is sulfuric acid at a temperature greater than 125° C.

19. The method of claim 16 where the thin film resistor material comprises CrSi and wherein the hard mask comprises one of TiW and molybdenum and the first etchant comprises hydrogen peroxide.

20. The method of claim 19 wherein the second etchant is a mixture of phosphoric acid, nitric acid and hydrofluoric acid.

21. The method of claim 16 further comprising the step of depositing electrical interconnects on the exposed thin film resistor material.

22. The method of claim 16 where the hard mask comprises a material selected from the group of materials consisting of silicon dioxide, silicon nitride, titanium nitride, molybdenum, and titanium tungsten.

23. The method of claim 11 further comprising the step of etching the remaining portion of the hard mask with hydrogen peroxide to thereby expose the NiCr film therebeneath.

24. The method of claim 23 further comprising the step of depositing electrical interconnects on the exposed NiCr film.

25. The method of claim 11 further comprising the step of etching the remaining portion of the hard mask except the portions of the hard mask overlying selected portions of the NiCr film for contacting electrical interconnects.

26. The method of claim 25 further comprising the step of depositing electrical interconnects on the remaining hard mask portions.

27. The method of claim 12 further comprising the step of etching the remaining portion of the hard mask with hydrogen peroxide to thereby expose the CrSi film therebeneath.

28. The method of claim 27 further comprising the step of depositing electrical interconnects on the exposed CrSi film.

29. The method of claim 12 further comprising the step of etching the remaining portion of the hard mask except the portions of the hard mask overlying selected portions of the CrSi film for contacting electrical interconnects.

30. The method of claim 29 further comprising the step of depositing electrical interconnects on the remaining hard mask portions.

* * * * *